United States Patent
Kurz et al.

(10) Patent No.: US 11,251,045 B2
(45) Date of Patent: Feb. 15, 2022

(54) DEVICE AND METHOD FOR BONDING OF SUBSTRATES

(71) Applicant: EV Group E. Thallner GmbH, St. Florian am Inn (AT)

(72) Inventors: Florian Kurz, Taufkirchen/Pram (AT); Thomas Wagenleitner, Aurolzmunster (AT); Thomas Plach, Stadl-Paura (AT); Jurgen Markus Suss, Rainbach (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 0 days.

(21) Appl. No.: 17/088,654

(22) Filed: Nov. 4, 2020

(65) Prior Publication Data

US 2021/0074544 A1 Mar. 11, 2021

Related U.S. Application Data

(63) Continuation of application No. 16/923,530, filed on Jul. 8, 2020, now Pat. No. 10,861,699, which is a
(Continued)

(51) Int. Cl.
*H01L 21/18* (2006.01)
*H01L 21/20* (2006.01)
(Continued)

(52) U.S. Cl.
CPC ........ *H01L 21/187* (2013.01); *H01L 21/2007* (2013.01); *H01L 21/67092* (2013.01);
(Continued)

(58) Field of Classification Search
CPC ............... H01L 21/187; H01L 21/2007; H01L 21/67092
See application file for complete search history.

(56) References Cited

U.S. PATENT DOCUMENTS 6,881,596 B2 4/2005 Malville et al.
7,645,682 B2 1/2010 Kerdiles et al.
(Continued)

FOREIGN PATENT DOCUMENTS

CN 1650415 A 8/2005
CN 100375256 C 3/2008
(Continued)

OTHER PUBLICATIONS

International Search Report from corresponding International Patent Application No. PCT/EP2016/053270, dated Oct. 12, 2016.
(Continued)

*Primary Examiner* — Errol V Fernandes
(74) *Attorney, Agent, or Firm* — Kusner & Jaffe

(57) ABSTRACT

A method for bonding a first substrate with a second substrate at respective contact faces of the substrates with the following steps: holding the first substrate to a first sample holder surface of a first sample holder with a holding force $F_{H1}$ and holding the second substrate to a second sample holder surface of a second sample holder with a holding force $F_{H2}$; contacting the contact faces at a bond initiation point and heating at least the second sample holder surface to a heating temperature $T_H$; bonding of the first substrate with the second substrate along a bonding wave running from the bond initiation point to the side edges of the substrates, wherein the heating temperature $T_H$ is reduced at the second sample holder surface during the bonding.

20 Claims, 5 Drawing Sheets

Related U.S. Application Data continuation of application No. 16/821,139, filed on Mar. 17, 2020, now Pat. No. 10,748,770, which is a continuation of application No. 16/667,102, filed on Oct. 29, 2019, now Pat. No. 10,636,662, which is a continuation of application No. 16/123,494, filed on Sep. 6, 2018, now Pat. No. 10,504,730, which is a continuation of application No. 15/514,182, filed as application No. PCT/EP2016/053270 on Feb. 16, 2016, now Pat. No. 10,109,487.

(51) Int. Cl.
    *H01L 21/67*     (2006.01)
    *H01L 21/66*     (2006.01)
    *H01L 25/00*     (2006.01)

(52) U.S. Cl.
    CPC .............. *H01L 22/12* (2013.01); *H01L 22/20* (2013.01); *H01L 25/50* (2013.01); *H01L 21/67253* (2013.01)

(56) References Cited

U.S. PATENT DOCUMENTS

| | | |
|---|---|---|
| 7,682,933 B1 | 3/2010 | Loomis |
| 8,349,703 B2 | 1/2013 | Kerdiles et al. |
| 8,640,548 B2 | 2/2014 | Wimplinger |
| 9,296,193 B2 | 3/2016 | Burggraf et al. |
| 10,014,193 B2 | 7/2018 | Lindner |
| 10,279,575 B2 | 5/2019 | Wagenleitner et al. |
| 10,971,378 B2 | 4/2021 | Lindner |
| 2004/0005727 A1 | 1/2004 | Malville et al. |
| 2004/0178448 A1 | 9/2004 | Rayssac et al. |
| 2008/0200008 A1 | 8/2008 | Kerdiles et al. |
| 2010/0093152 A1 | 4/2010 | Kerdiles et al. |
| 2011/0168317 A1 | 7/2011 | Deming et al. |
| 2011/0217795 A1 | 9/2011 | Tanida et al. |
| 2011/0308721 A1 | 12/2011 | Broekaart et al. |
| 2012/0077329 A1 | 3/2012 | Broekaart et al. |
| 2014/0209230 A1 | 7/2014 | Wagenleitner |
| 2015/0044786 A1 | 2/2015 | Huang et al. |
| 2015/0210057 A1 | 7/2015 | Wagenleithner et al. |
| 2016/0009070 A1 | 1/2016 | Hayashi et al. |
| 2017/0120567 A1 | 5/2017 | Fournel et al. |

FOREIGN PATENT DOCUMENTS

| | | |
|---|---|---|
| EP | 2 463 892 B1 | 4/2013 |
| EP | 2 697 823 B1 | 6/2014 |
| JP | 2003-347385 A | 12/2003 |
| JP | 2011-222809 A | 11/2011 |
| JP | 2012-191307 A | 10/2012 |
| JP | 2013-120901 A | 6/2013 |
| KR | 10-2009-0111838 A | 10/2009 |
| TW | 201513172 A | 4/2015 |
| TW | 201534476 A | 9/2015 |
| WO | WO-03/094222 A1 | 11/2003 |
| WO | WO-2012/079597 A1 | 6/2012 |
| WO | WO-2012/083978 A1 | 6/2012 |
| WO | WO-2013/023708 A1 | 2/2013 |
| WO | WO-2013/091714 A1 | 6/2013 |
| WO | WO-2014/191033 A1 | 12/2014 |
| WO | WO-2015/113641 A1 | 8/2015 |

OTHER PUBLICATIONS

Chris Mack, "Fundamental Principals of Optical Lithography," The Science of Microfabrication, 2007, p. 321.

Office Action issued in corresponding U.S. Appl. No. 15/514,182 dated Feb. 16, 2018.

Office Action issued in corresponding Japanese Patent Application No. 2020-184520 dated Sep. 16, 2021 along with a partial English-language translation.

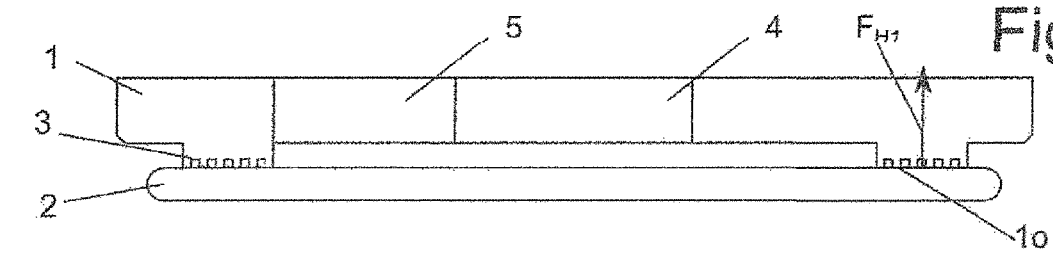
Fig. 1a
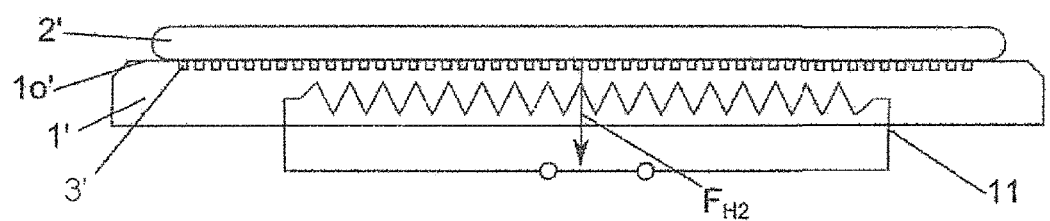
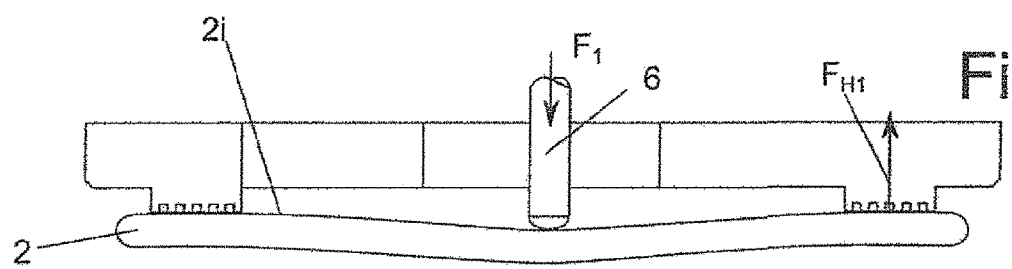
Fig. 1b
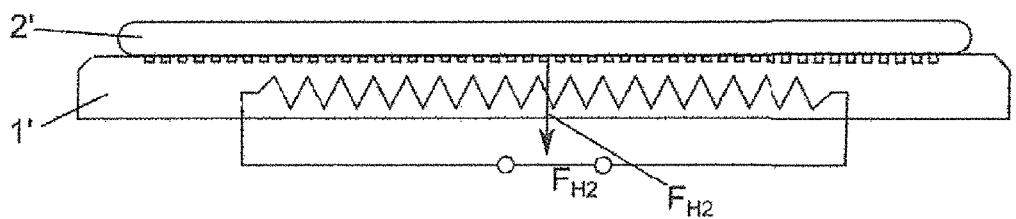
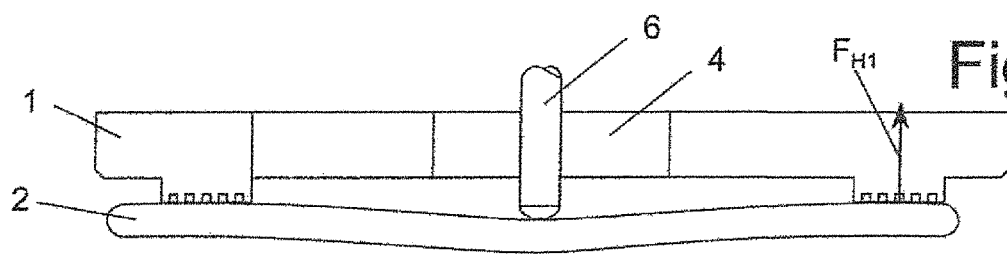
Fig. 1c
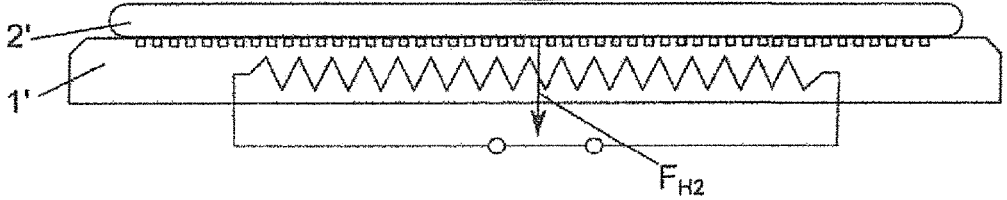

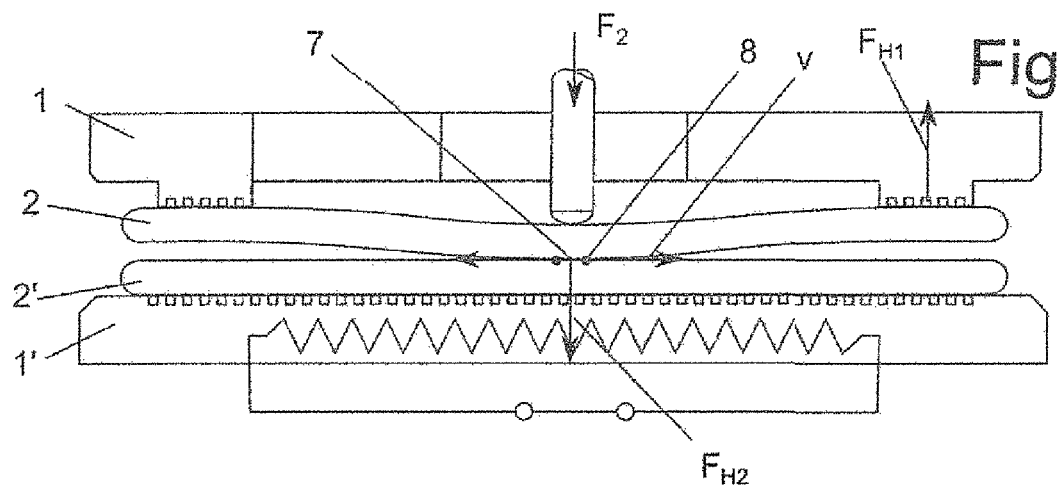
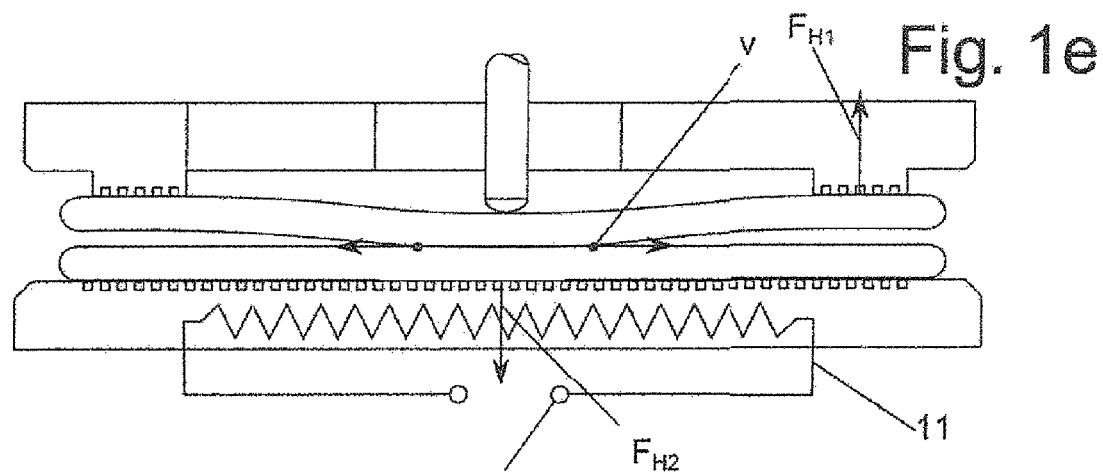
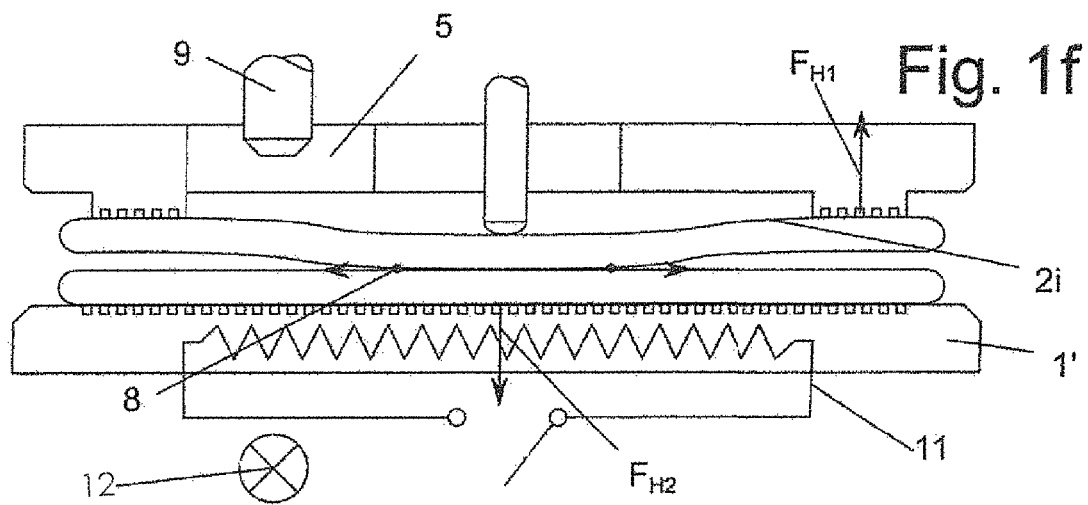

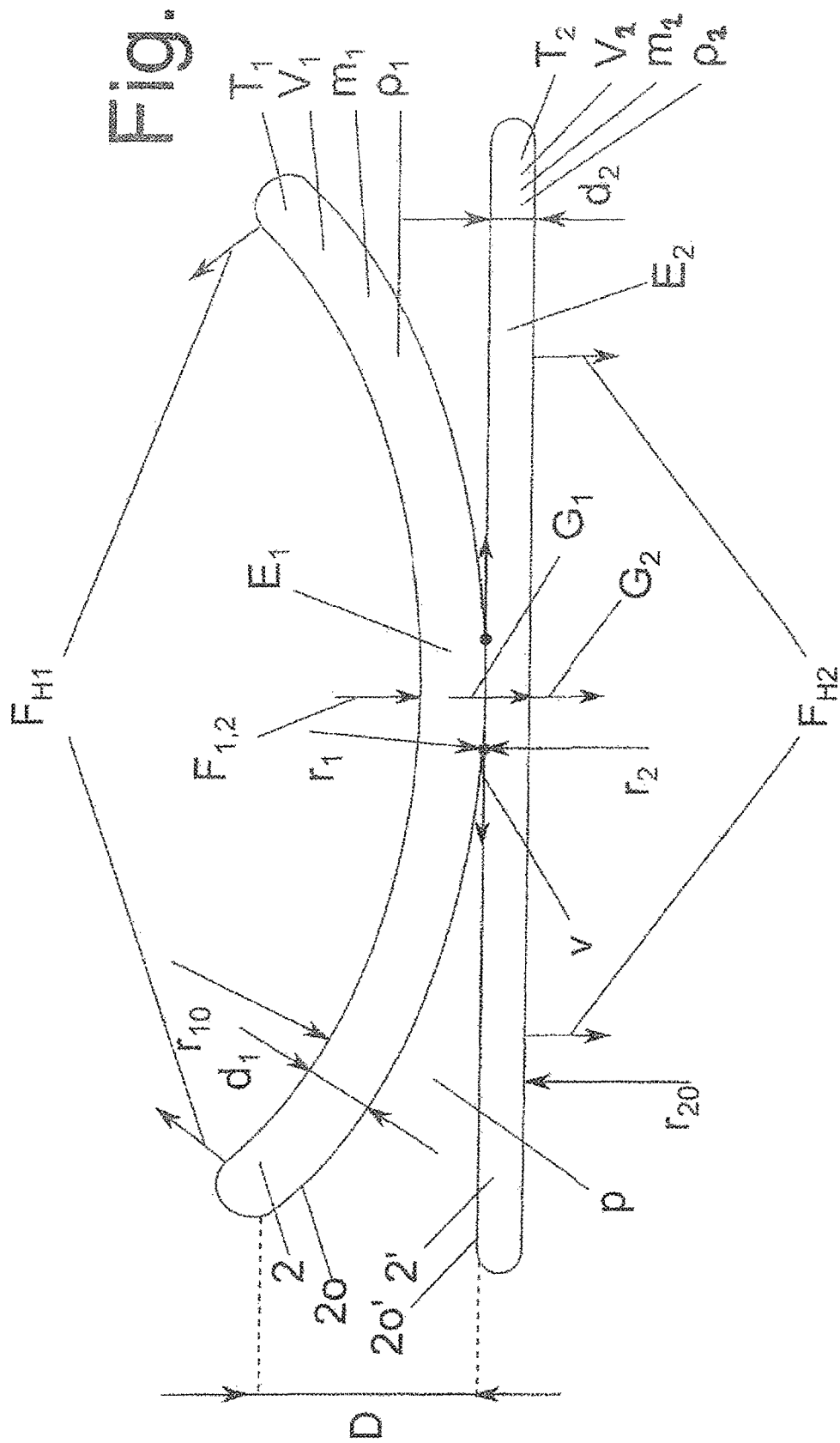

DEVICE AND METHOD FOR BONDING OF SUBSTRATES

RELATED APPLICATIONS

This application is a continuation of U.S. application Ser. No. 16/923,530, filed Jul. 8, 2020, which is a continuation of U.S. application Ser. No. 16/821,139, filed Mar. 17, 2020 (now U.S. Pat. No. 10,748,770), which is a continuation of U.S. application Ser. No. 16/667,102, filed Oct. 29, 2019 (now U.S. Pat. No. 10,636,662), which is a continuation of U.S. application Ser. No. 16/123,494, filed Sep. 6, 2018 (now U.S. Pat. No. 10,504,730, issued Dec. 10, 2019), which is a continuation of U.S. application Ser. No. 15/514,182, filed Mar. 24, 2017 (now U.S. Pat. No. 10,109,487, issued Oct. 23, 2019), which is the U.S. National Stage of International Application No. PCT/EP2016/53270, filed Feb. 16, 2016, said patent applications herein fully incorporated by reference.

FIELD OF THE INVENTION

The invention relates to a method for bonding a first substrate with a second substrate.

BACKGROUND OF THE INVENTION

Substrates have been aligned with one another and joined with one another for many years in the semiconductor industry. The joining, the so-called bonding, serves to build up a multi-substrate stack. In such a multi-substrate stack, functional units, in particular memory chips, microprocessors, MEMS etc. are connected to one another and thus combined with one another. Diverse possible applications arise from these combination options.

The density of the functional units is increasing year by year. As a result of advancing technological development, the size of the functional units is becoming smaller and smaller. The increasing density is therefore accompanied by a greater number of functional units per substrate. This increasing number of units is primarily responsible for the reduction in parts costs.

The primary drawback with increasingly small functional units is in the increasing difficulty of producing an error-free, in particular complete superposition of all the functional units along the bond interface of the two substrates.

The greatest problem in present-day alignment technology, therefore, is not always aligning two substrates with one another, in particular two wafers, with the aid of alignment marks, but rather in producing an error-free, in particular complete correlation of points of the first substrate with points of a second substrate, said correlation thus extending over the entire area of the substrate. Experience shows that the structures on the surfaces of the substrates after the bonding process are generally not congruent with one another. A general, in particular overall, alignment and a following bonding step of two substrates are thus not always sufficient to obtain a complete and error-free congruence of the desired points at every point of the substrate surfaces.

There are two fundamental problems in the prior art that stand in the way of a straightforward overall alignment and a subsequent bonding step.

In the first place, the positions of the structures of the first and/or second substrates are generally subject to a deviation from the theoretical positions. There may be a number of reasons for this deviation.

It would be conceivable, for example, that the actual produced structures deviate from their ideal positions because the production processes were defective or at least involved a tolerance. An example of this would be the repeated use of lithography by means of a step-and-repeat process, which during each translational displacement of the stamp involves a small, but significant error in the position.

A further, less trivial reason would be the deformation of the substrate due to mechanical, but in particular thermal loading. A substrate has a defined temperature for example at the time of the production of the structures. This temperature is generally not maintained for the entire process sequence of the substrate, but on the contrary changes. The temperature change is accompanied by a thermal expansion and therefore in the most ideal case a change in diameter, in the most unfavorable case a complex thermal deformation.

In the second place, even two substrates which have error-free, in particular full-area congruence, i.e. overlapping of all structures, shortly before the contacting and the actual bonding process can lose this congruence during the bonding process. The bonding process itself thus has a decisive influence in the production of an error-free substrate stack, i.e. having perfect congruence of the structures.

In the third place, layers and structures that are applied on the substrates may generate stresses in a substrate. The layers may for example be insulation layers, the structures may be through-silicon-vias (TSVs).

One of the greatest technical problems with the permanent bonding of two substrates is the alignment accuracy of the functional units between the individual substrates. Although the substrates can be very precisely aligned with respect to one another by means of alignment equipment, distortions of the substrates can arise during the bonding process itself. As a result of the distortions thus arising, the functional units will not necessarily be correctly aligned with one another at all positions. The alignment inaccuracy at a specific point on the substrate may be a result of a distortion, a scaling error, a lens error (magnification or reduction error) etc. In the semiconductor industry, all subject areas dealing with such problems are combined under the term "overlay". A suitable introduction to this subject can be found for example in: *Mack, Chris. Fundamental Principles of Optical Lithography—The Science of Microfabrication. WILEY, 2007, Reprint 2012.*

Each functional unit is designed in the computer before the actual production process. For example, strip conductors, microchips, MEMS, or any other structure producible with the aid of microsystem technology, are designed in a CAD (computer aided design) program. During the production of the functional units, it can however be seen that there is always a deviation between the ideal functional units designed on the computer and the real functional units produced in the clean room. The differences are primarily due to limitations of the hardware, i.e. engineering-related problems, but very often physical limitations. Thus, the resolution accuracy of a structure that is produced by a photolithographic process is limited by the size of the apertures of the photomask and the wavelength of the light used. Mask distortions are directly transferred to the photoresist. Linear motors of machines can only approach reproducible positions within a given tolerance, etc. It is not therefore surprising that the functional units of a substrate cannot be exactly identical to the structures designed on the computer. Even before the bonding process, all substrates thus have a non-negligible divergence from the ideal state.

If the positions and/or shapes of two opposite-lying functional units of two substrates are compared on the assumption that neither of the two substrates is distorted by a bonding process, it is found that in general there is already an imperfect congruence of the functional units, since the latter diverge from the ideal computer model due to the errors described above. The most frequent errors are represented in FIG. 8 (Copied from: http://commons.wikimedia.org/wiki/File:Overlay_typical-model_terms_DE.svg, 24.05.2013 and Mack, Chris. Fundamental Principles of Optical Lithography—The Science of Microfabrication. Chichester: WILEY, p. 321, 2007, Reprint 2012).

According to the illustrations, a rough distinction can be made between overall and local as well as symmetrical and asymmetrical overlay errors. An overall overlay error is homogeneous, therefore independent of location. It produces the same divergence between two opposite-lying functional units irrespective of the position. The conventional overall overlay errors are errors I and II, which arise due to a translation or rotation of the two substrates with respect to one another. The translation or rotation of the two substrates produces a corresponding translational or rotational error for all the functional units lying respectively opposite one another on the substrates. A local overlay error arises in a location-dependent manner, mainly due to elasticity and/or plasticity problems and/or preliminary processes, in the present case primarily caused by the continuously propagating bonding wave. Of the represented overlay errors, errors III and IV are in particular referred to as "run-out" errors. This error arises primarily due to a distortion of at least one substrate during a bonding process. As a result of the distortion of at least one substrate, the functional units of the first substrate are also distorted in respect of the functional units of the second substrate. Errors I and II can however also arise due to a bonding process, but they are usually superimposed by errors III and IV to such a marked extent that it is difficult to detect or measure them. This applies to bonders, in particular fusion bonders of the latest design, which have an extremely accurate capability for x- and/or y- and/or rotation correction.

There is already a plant in the prior art, with the aid of which local distortions can be reduced at least partially. It concerns here a local distortion due to the use of active control elements (WO2012/083978A1).

Initial approaches to a solution for correcting "run-out" errors exist in the prior art. US20120077329A1 describes a method for obtaining a desired alignment accuracy between the functional units of two substrates during and after the bonding, whereby the lower substrate is not fixed. The lower substrate is thus not subjected to any boundary conditions and can bond freely to the upper substrate during the bonding process. An important feature in the prior art is, in particular, the flat fixing of a substrate, usually by means of a vacuum device.

In most cases, the arising "run-out" errors become more intensified in a radially symmetrical manner around the contact point, for which reason they increase from the contact point to the periphery. In most cases, it involves a linearly increasing intensification of the "run-out" errors. Under special conditions, the "run-out" errors can also increase non-linearly.

Under particularly optimum conditions, the "run-out" errors can be ascertained not only by suitable measuring devices (EP2463892), but can also be described by mathematical functions. Since the "run-out" errors represent translations and/or rotations and/or scaling between well-defined points, they are preferably described by vector functions. Generally, this vector function is a function $f:R^2 \rightarrow R^2$, i.e. a mapping rule, which maps the two-dimensional definition range of the position coordinates onto the two-dimensional value range of "run-out" vectors. Although an exact mathematical analysis of the corresponding vector fields has not yet been able to be carried out, assumptions are made concerning the function properties. The vector functions are, with a high degree of probability, at least $C^n$ $n>=1$ functions, i.e. at least continuously differentiable. Since the "run-out" errors increase from the contact point to the edge, the divergence of the vector function will probably be different from zero. With a high degree of probability, therefore, the vector field is a source field.

The "run-out" error is best ascertained in relation to structures. A structure is understood to mean any element of a first or second substrate which is to be correlated with a structure on the second or respectively first substrate. In the case of a structure, it thus relates for example to alignment marks corners and/or edges, in particular corners and edges of functional units contact pads, in particular Through Silicon Vias (TSVs) or Through Polymer Vias (TPVs)

strip conductors recesses, in particular holes or depressions

The "run-out" error is generally position-dependent and, in the mathematical sense, a displacement vector, between a real and an ideal point. Since the "run-out" error is generally position-dependent, it is ideally specified by vector fields. In the subsequent text, the "run-out" error will, unless stated otherwise, be regarded solely as punctiform in order to facilitate the description.

"Run-out" error R comprises two partial components.

First partial component R1 describes the intrinsic part of the "run-out" error, i.e. the part that can be traced back to the defective production of the structures or a distortion of the substrate. It is therefore inherent in the substrate. It should be noted that a substrate can also have an intrinsic "run-out" error when the structures have been correctly produced at a first temperature, but the substrate is subject to a temperature change to a second temperature prior to the bonding process and thermal expansions thus occur, which distort the entire substrate and therefore also the structures located thereon.

Temperature differences of a few Kelvin, sometimes even a tenth of a Kelvin, are already sufficient to generate such distortions.

Second partial component R2 describes the extrinsic part of the "run-out" error, i.e. the part that is not caused until the bonding process. It is not present before the bonding process. This includes primarily local and/or overall distortions of the first and/or second substrate due to forces acting between the substrates, which can lead to a deformation in the nanometer range.

SUMMARY OF THE INVENTION

An object of the present invention is to provide a method for bonding two substrates, with which the bonding accuracy is increased as far as possible at every position of the substrates. It is a further object of the invention to provide a method with which an error-free, in particular full-area congruence of the structures of two substrates can be produced.

Drawbacks of the prior art are solved with the features of the independent claim(s). Advantageous developments of the invention are given in the sub-claims. All combinations of at least two features given in the description, in the claims and/or the drawings also fall within the scope of the invention. In the stated value ranges, values lying inside the stated limits are also deemed to be disclosed as limiting values and can be claimed in any combination. If an individual or a plurality of method steps can be performed on different devices or modules, the latter are in each case disclosed separately as an independent method.

The idea underlying the invention is to reduce a heating temperature $T_H$ already during the bonding and to switch off heating during the bonding. Heating temperature $T_H$ serves in particular to produce a temperature sufficient for the bonding at a bonding face of the substrates. An important aspect of a further embodiment according to the invention includes removing the fixing of a substrate, in particular during the bonding, in order to permit free deformability of the substrate stack to the bonded. A further important aspect of a third embodiment according to the invention includes the possibility of the substrate stack, in particular its interface, being ventilated or subjected to pressure during the bonding.

As a first and/or second substrate wafers are particularly qualified.

A characteristic process according to the invention during the bonding, in particular permanent bonding, preferably fusion bonding, is the most concentric, punctiform possible contacting of the two substrates. In particular, the contacting of the two substrates can also take place in a non-concentric manner. The bonding wave being propagated from a non-concentric contact point would reach different sides of the substrate edge at different times. The complete mathematical-physical description of the bonding wave behavior and of the resultant "run-out" error compensation would be correspondingly complicated. In particular, the contacting point will not be located far from the centre of the substrate, so that the effects possibly resulting therefrom are negligible, at least at the edge. The distance between a possible non-concentric contacting point and the centre of the substrate is preferably less than 100 mm, with preference less than 10 mm, with greater preference less than 1 mm, with greatest preference less than 0.1 mm, with the greatest possible preference less than the 0.01 mm. In the further description, contacting should as a rule be understood to mean concentric contacting. In the broader sense, centre is preferably understood to mean the geometrical centre-point of a basic ideal body, if necessary compensated for asymmetries. In the case of wafers standard in the industry with a notch, the centre is therefore the circle centre-point of the circle that surrounds the ideal wafer without a notch. In the case of wafers standard in the industry with a flat (flattened side), the centre is the circle centre-point of the circle that surrounds the ideal wafer without a flat. Analogous considerations apply to arbitrarily shaped substrates. In specific embodiments, it may however be useful for the centre to be understood as the centre of gravity of the substrate. In order to ensure an exact, concentric punctiform contacting, an upper holding device (sample holder) provided with a central bore and a pin movable in a translational manner therein is provided with a radially symmetrical fixing. The use of a nozzle, which uses a fluid, preferably a gas, instead of the pin for the application of pressure, would also be conceivable. Furthermore, the use of such elements can even be completely dispensed with, if devices are provided which can cause the two substrates to approach one another by a translational movement, with the further provision that at least one of the two substrates, preferably the upper substrate, has an impressed curvature in the direction of the other substrate on account of gravitation, and therefore automatically makes contact during the aforementioned translational approach, with a sufficiently small spacing with respect to the corresponding second substrate.

The radially symmetrical fixing/holding involves either provided vacuum holes, a circular vacuum lip or comparable vacuum elements, with the aid of which the upper substrate can be fixed. The use of an electrostatic holding device is also conceivable. The pin in the central bore of the upper sample holder serves for the controllable deflection of the fixed, upper substrate.

In a further embodiment according to the invention, the holding device is designed in such a way that the first and/or second substrate is curved in a convex and/or concave manner by a generated over- and/or under-pressure in the sample holder. For this purpose, vacuum tracks and/or cavities through which fluids can flow or which can be evacuated are preferably provided in the holding device. The use of a nozzle for the pinpoint application of pressure can be dispensed with in favor of a pressure building up globally. According to the invention, embodiments are conceivable wherein the substrate is sealed and/or otherwise fixed, in particular at the edge. If, for example, a holding device is designed which generates an under-pressure relative to the external atmosphere, a seal at the edge of the substrate is sufficient. If an over-pressure is generated inside the holding device in order to curve the substrate outwards, i.e. in a convex manner, the substrate is preferably fixed at the edge, in particular mechanically. As a result of the application of an under-pressure or over-pressure on the substrate from the underside, the curvature of the substrate can be adjusted exactly.

After the contacting of the centers of the two substrates has taken place, the fixing of the upper sample holder is released, in particular in a controlled and gradual manner. The upper substrate drops down, on the one hand due to gravity and on the other hand due to a bonding force acting along the bonding wave and between the substrates. The upper substrate is bonded to the lower substrate radially from the centre to the side edge. A formation of a radially symmetrical bonding wave according to the invention thus arises, which runs in particular from the centre to the side edge. During the bonding process, the two substrates press the gas, in particular air, present between the substrates ahead of the bonding wave and thus ensure a bonding interface without gas inclusions. The upper substrate virtually lies on a kind of gas cushion during the descent.

The first/upper substrate is not subject to any additional fixing after the initiation of the bond at a bond initiation point, i.e. it can move freely apart from the fixing at the bond initiation point and can also become distorted. As a result of the bonding wave advancing according to the invention, the stress states arising at the bonding wave front and the prevailing geometrical boundary conditions, each circle segment, infinitesimally small compared to its radial thickness, is subject to a distortion. However, since the substrates represent rigid bodies, the distortions add up as a function of the distance from the centre. This leads to "run-out" errors, which are intended to be eliminated by the method according to the invention and the device according to the invention.

The invention thus relates to a method and a device for reducing or even completely preventing the "run-out" error between two bonded substrates during bonding, in particular by thermodynamic and/or mechanical compensation mechanisms. Furthermore, the invention deals with a corresponding article, which is produced with the device according to the invention and the method according to the invention.

The "run-out" error is in particular dependent on the position on the substrate along the substrate surface. It emerges in particular that the "run-out" error increases from the centre to the periphery of the substrate. Such radially symmetrical run-outs occur mainly in the case of fusion-bonded substrates, which are contacted centrally by means of a pin and the bonding wave whereof propagates automatically, in particular radially, after the contacting.

The "run-out" error is particularly dependent on the speed of the bonding wave. The "run-out" error will generally be greater, the higher the bonding wave speed. According to the invention, therefore, bonding wave speeds are preferably set which are less than 100 mm/s, preferably less than 50 mm/s, still more preferably less than 10 mm/s, most preferably less than 1 mm/s, most preferably of all less than 0.1 mm/s. In a particular embodiment according to the invention, the bonding wave speed is detected by measuring means.

The "run-out" error is particularly dependent on the spacing (gap) between the two substrates immediately before the start of the (pre-)bonding process. If the upper, first substrate, in particular, is deformed by deformation means with a first force $F_1$, the spacing between the substrates is a function of the location. In particular, the spacing between the substrates is greatest at the edge. The minimum spacing is located in the region of the convex maximum of the deformed substrate. The shape of a deformed substrate thus also has an influence on the "run-out" error. The spacing between the substrates at the edge (substrate edge spacing D) directly before the bonding is in particular less than 5 mm, preferably less than 2 mm, still more preferably less than 1 mm, most preferably less than 0.5 mm, most preferably of all less than 0.1 mm. The spacing between the substrates beneath the convex maximum directly before the bonding is in particular less than 1 mm, preferably less than 100 µm, still more preferably less than 10 µm, most preferably less than 1 µm, most preferably of all less than 100 nm.

The "run-out" error is particularly dependent on the type and shape of the sample holder and the resultant fixing/holding of the respective substrate. Publication WO2014/191033A1 discloses a number of embodiments of preferred sample holders, to which reference is made in this regard. In the processes disclosed, a release of the substrate from a sample holder after the removal of the fixing, in particular vacuum fixing, is of crucial importance. The surface roughness of the sample holder is selected as great as possible, its waviness as small as possible. A great surface roughness ensures as few contact points as possible between the sample holder surface and the substrate. The separation of the substrate from the sample holder therefore takes place with minimum expenditure of energy. The waviness is preferably minimal, in order not to create new sources of a "run-out" due to the sample holder surface. It is pointed out that the comments concerning the waviness do not mean that the surface of the sample holder may not also be curved as a whole.

The roughness is indicated as an average roughness, quadratic roughness or as an average roughness depth. The averaged values for the average roughness, the quadratic roughness and the average depth generally differ for the same measurement section or measurement area, but lie in the same range in terms of order of magnitude. The following numerical value ranges for the roughness are therefore to be understood either as values for the average roughness, the quadratic roughness or for the average roughness depth. The roughness is set in particular greater than 10 nm, preferably greater than 100 nm, more preferably greater than 1 µm, most preferably greater than 10 µm, most preferably of all greater than 100 µm. The "run-out" error is particularly dependent on time-related aspects. A bonding wave propagating too quickly does not give the material of the substrates enough time shortly after and/or at and/or before the bonding wave to bond together in the optimum manner. It may therefore also be of crucial importance to control the bonding wave in a time-dependent manner.

The "run-out" error is particularly dependent on the loading procedure of the substrate on the sample holder. When the substrate is loaded and fixed, a distortion of the substrate may occur which is maintained by the fixing and is also introduced into the substrate stack during the (pre-)bond. The substrate is therefore transferred from an end effector onto the sample holder as far as possible without distortion.

The "run-out" error is particularly dependent on temperature differences and/or temperature fluctuations between the two substrates. The substrates are fed in particular from different process steps or different process modules to the bonding module. Different processes may have been carried out at different temperatures in these process modules. Furthermore, the upper and lower sample holder may have a different structure, a different type of design and therefore different physical, especially thermal, properties. It is conceivable for example that the thermal masses and/or the thermal conductivities of the sample holders differ from one another. This leads to a different loading temperature or to a different temperature at the time of the (pre-)bond. The sample holders for performing the processes according to the invention are therefore preferably provided with heating and/or cooling systems, so that the temperature of at least one substrate (preferably both) can be adjusted exactly. In particular, it is conceivable to adapt the temperatures of the two substrates to different values, so that the substrate is thermally distorted overall by at least one of the two substrates being subjected to a thermal action. The adaptation of a substrate to a desired initial state is thus achieved, in particular to compensate for "run-out" error component R1.

The "run-out" error is particularly dependent on the ambient pressure. The effects of the ambient pressure have been discussed and disclosed comprehensively in WO2014/191033A1. Reference is made thereto in this regard.

The "run-out" error is particularly dependent on a symmetry of the system, so that preferably as many components as possible (still more preferably at least the overwhelming part) are build up and/or arranged symmetrically. In particular, the thicknesses of the substrates are different. Furthermore, different layer sequences of different materials with different mechanical properties may be present on each substrate and may have to be taken into account. Furthermore, one of the substrates is preferably deformed, whereas the other substrate lies flat on the sample holder. All the properties, parameters and embodiments which lead to an asymmetry being present have in particular an effect on the "run-out" error. Some of these asymmetries cannot be avoided. Thus, the thicknesses of substrates, the layers on the substrates and the functional units are defined by the process and customer specifications. According to the invention, an attempt is made to minimize as far as possible, in particular to completely eliminate, the "run-out" in particular by varying other variable parameters.

In particular, the "run-out" error is position-dependent. The aim of the measures according to the invention is, in particular, to obtain at each position a "run-out" error which is smaller than 10 µm, is preferably smaller than 1 µm, is still more preferably smaller than 100 nm, is most preferably smaller than 10 nm, is most preferably of all smaller than 1 nm.

The sample holders that are preferably used for the embodiments according to the invention comprise fixing means. The fixing means serve to fix the substrates with a fixing force or with a corresponding fixing pressure. The fixing means can in particular be the following:
- mechanical fixing means, in particular clamps, or
- vacuum fixing means, in particular with
  - individually controllable vacuum tracks or
  - vacuum tracks connected to one another, or
- electrical fixing means, in particular electrostatic fixing means, or
- magnetic fixing means or
- adhesive fixing means, in particular
  - Gel-Pak fixing means or
- fixing means with adhesive, in particular controllable, surfaces.

The fixing means are in particular electronically controllable. The vacuum fixing means is the preferred kind of fixing. The vacuum fixing means preferably comprises a plurality of vacuum tracks, which emerge at the surface of the sample holder. The vacuum tracks are preferably individually controllable. In a technically preferred application, several vacuum tracks are united to form vacuum track segments which are individually controllable, i.e. can be evacuated or flooded separately. Each vacuum segment is preferably independent of the other vacuum segments. The possibility of constituting individually controllable vacuum segments is thus obtained. The vacuum segments are preferably designed annular. A targeted, radially symmetrical fixing and/or release of a substrate from the sample holder, in particular performed from the inside outwards, is thus enabled or vice versa.

Possible sample holders are disclosed in publications WO2014/191033A1, WO2013/023708A1, WO2012/079597A1 and WO2012/083978A1. Reference is made thereto in this regard.

During at least one, preferably all the processes steps according to the invention, it is advantageous to detect the advance of the bonding wave or at least the state of the bonding wave and thus to ascertain the latter at specific times. For this purpose, measuring means are preferably provided, in particular with cameras. The monitoring preferably takes place by means of:
- cameras, in particular visual cameras or infrared cameras, and/or
- conductivity measuring devices.

If the determination of the position of the bonding wave takes place with the aid of a camera, the position of the bonding wave, in particular the course of the bonding wave, can be detected at any time. The camera is preferably an infrared camera, which digitalizes the data and relays the latter to a computer. The computer then enables the evaluation of the digital data, in particular the determination of the position of the bonding wave, the size of the bonded area or further parameters.

A further possibility for monitoring the advance of the bonding wave includes a measurement of the surface conductivity, which changes with an advancing bonding wave. For this purpose, the prerequisites for such a measurement must be present. The measurement of the surface conductivity takes place in particular by contacting of two electrodes at two opposite-lying positions of a substrate. In a particular embodiment according to the invention, the electrodes contact the edge of the substrates, wherein they do not hinder the bonding of the substrates at the edge. In a second, less preferred embodiment according to the invention, the electrodes are withdrawn from the surface before the bonding wave reaches the side edge of the substrates.

Processes are described below, wherein these processes preferably proceed in the described sequence, in particular as separate steps. Unless the description states otherwise, the process steps and disclosures are each transferable from one embodiment to the other, if this is technically capable of performance by the person skilled in the art.

In a first process step of a first embodiment of the method according to the invention, two substrates are positioned and fixed on sample holders, one on a first/upper sample holder, the second on a second/lower sample holder. The feeding of the substrates can take place manually, but preferably by means of a robot, i.e. automatically. The upper sample holder preferably comprises deformation means for the targeted, in particular controllable deformation of the upper, first substrate with a first force $F_1$. The upper sample holder comprises in particular at least one opening, through which a deformation means, in particular a pin, can bring about the mechanical deformation of the upper, first substrate. Such a sample holder is disclosed for example in publication WO2013/023708A1.

In a second process step, the deformation means, in particular a pin, contacts the rear side of the upper, first substrate and produces a slight deformation, in particular a deflection, indicated as concave from the side of the deformation means (i.e. from above). The deformation means acts on the first substrate in particular with a first force $F_1$ of more than 1 mN, preferably more than 10 mN, still more preferably more than 50 mN, most preferably more than 100 mN, but in particular less than 5000 mN. The force is too small to release the upper first substrate from the sample holder, but strong enough to produce the deflection according to the invention. The force preferably acts as far as possible in a punctiform manner on the substrate. Since a punctiform action does not actually exist, the force preferably acts on a very small area. The area is in particular less than 1 cm$^2$, preferably less than 0.1 cm$^2$, still more preferably less than 0.01 cm$^2$, most preferably of all less than 0.001 cm$^2$. In the case of action on an area of 0.001 cm$^2$, the acting pressure according to the invention is in particular greater than 1 MPa, preferably greater than 10 MPa, still more preferably more than 50 MPa, and most preferably greater than 100 MPa, and most preferably of all greater than 1000 MPa. The disclosed pressure ranges also apply to the other areas disclosed above.

In a third process step, a relative approach of the two substrates, in particular through the relative approach of the sample holders, in particular takes place. Preferably, the lower sample holder is raised, so that the lower, second substrate actively approaches the upper, first substrate. The active approach of the upper sample holder towards the lower sample holder or the simultaneous approach of both sample holders towards one another is however also conceivable. The approach of the two substrates takes place in particular up to a spacing between the 1 μm and 2000 μm, preferably between 10 μm and 1000 μm, still more preferably between 20 μm and 500 μm, and most preferably between 40 μm and 200 μm. The spacing is defined as the smallest vertical distance between two surface points of the substrates.

Before the bonding or pre-bonding, or contacting, the first and/or the second substrate are heated by heating means and/or cooled by cooling means, i.e. temperature-regulated.

In a fourth process step, a further application of force on the upper, first substrate takes place. In a first approach according to the invention, the first substrate is acted upon by a second force $F_2$ of the deformation means of in particular more than 100 nM, preferably more than 500 mN, still more preferably more than 1500 mN, most preferably more than 2000 mN, most preferably of all more than 3000 mN. The first contacting of the upper, first substrate with the lower, second substrate is thus brought about and at least supported. The calculation of the preferably occurring pressures takes place by dividing the force by a minimally adopted area of 0.001 cm².

In a fifth process step, a deactivation of the heating means in particular takes place, in particular heating of the lower sample holder, arranged in particular integrally in the lower sample holder.

In a sixth process step, monitoring of the propagation of the advancing bonding wave in particular takes place (see also above "monitoring of the bonding wave"). The monitoring tracks the advance of the bonding wave and therefore the advance of the bonding process especially over a period of more than 1 s, preferably more than 2 s, still more preferably more than 3 s, most preferably more than 4 s, most preferably of all more than 5 s. Instead of tracking/controlling the bonding process over a time interval, tracking of the bonding wave can also be indicated via the, in particular radial, position of the bonding wave. The tracking of the bonding process takes place in particular until the bonding wave is at a radial position which corresponds to at least 0.1 times, preferably at least 0.2 times, still more preferably at least 0.3 times, most preferably at least 0.4 times, most preferably of all 0.5 times the diameter of the substrate. If tracking of the bonding advance is to be measured by means of conductivity measurements over the surface, the bonding advance can also take place via the percentage proportion of the bonded or non-bonded surface. The monitoring of the bonding advance according to the invention then takes place in particular until more than 1%, preferably more than 4%, still more preferably more than 9%, most preferably more than 16%, most preferably of all more than 25% of the area has been bonded. Alternatively, the monitoring takes place continuously.

A control of the process sequence preferably takes place on the basis of defined/set or settable values from the monitoring, which lie within the aforementioned value ranges. A first waiting time for the advance of the bonding wave and up to the initiation of the next process step results therefrom.

In a seventh process step, switching-off of the fixing means of the upper, first sample holder in particular takes place. It would also be conceivable for the upper, first substrate to be released by a targeted removal of the fixing. Especially in the case of vacuum fixing means, which comprise a plurality of individually controllable vacuum tracks, the targeted removal of the fixing takes place by means of a continuous removal of the vacuum, in particular from the centre to the edge. The seventh process step is initiated in particular at a point in time $t_1$, at which one of the parameters of the measuring means reaches a defined/set or settable value (see in particular sixth process step).

More generally, or to put it another way, holding force $F_{H1}$ is reduced during the bonding at a point in time $t_1$, in particular to an extent such that the first substrate is released from the first sample holder.

In an eighth process step, renewed or ongoing monitoring of the propagation of the advancing bonding wave in particular takes place by the measuring means. The monitoring tracks the advance of the bonding wave and therefore the advance of the bonding process, preferably over a period of more than 5 s, preferably more than 10 s, still more preferably more than 50 s, most preferably more than 75 s, most preferably of all more than 90 s. Instead of tracking the bonding process over a time interval, the tracking of the bonding wave can also be measured via the, in particular radial, position of the bonding wave. The tracking of the bonding process takes place in particular until the bonding wave is at a radial position which is at least 0.3 times, preferably at least 0.4 times, more preferably at least 0.5 times, most preferably 0.6 times, most preferably of all 0.7 times the diameter of the substrate. If tracking of the bonding advance is to be possible by means of conductivity measurements over the surface, the bonding advance can also take place via the percentage proportion of the bonded or non-bonded surface. The monitoring of the bonding advance according to the invention takes place until more than 9%, preferably more than 16%, still more preferably more than 25%, most preferably more than 36%, most preferably of all more than 49% of the area has been bonded. Alternatively, the monitoring takes place continuously.

A control of the process sequence preferably takes place on the basis of defined/set or settable values from the monitoring, which lie within the aforementioned value ranges. A second waiting time for the advance of the bonding wave and up to the initiation of the next process step results therefrom.

In a ninth process step, the application of the deformation means is stopped. If the deformation means is a pin, the pin is withdrawn. If the deformation means is one or more nozzles, the fluid flow is interrupted. If the deformation means are electrical and/or magnetic fields, the latter are switched off. The ninth process step is initiated in particular at a point in time at which one of these parameters of the measuring means reaches a defined/set or settable value (see in particular eighth process step).

In a tenth process step, renewed or ongoing monitoring of the propagation of the advancing bonding wave takes place. The monitoring tracks the advance of the bonding wave and therefore the advance of the bonding process, preferably over a period of more than 5 s, preferably more than 10 s, still more preferably more than 50 s, most preferably more than 75 s, most preferably of all more than 90 s. Instead of tracking the bonding process over a time interval, the tracking of the bonding wave can also be indicated via the, in particular radial, position of the bonding wave. The tracking of the bonding process takes place in particular until the bonding wave is at a radial position which is at least 0.6 times, preferably at least 0.7 times, more preferably at least 0.8 times, most preferably 0.9 times the diameter of the substrate. If the substrate has an edge profile, it is not possible to follow the tracking of the bonding process up to the outermost edge, since approx. 3-5 mm is not bonded on account of the edge profile. If tracking of the bonding advance is to be possible by means of conductivity measurements over the surface, the bonding advance can then also take place via the percentage proportion of the bonded or non-bonded surface. The monitoring of the bonding advance according to the invention takes place until more than 36%, preferably more than 49%, still more preferably more than 64%, most preferably more than 81%, most preferably of all more than 100% of the area has been bonded. Alternatively, the monitoring takes place continuously.

A control of the process sequence preferably takes place on the basis of defined/set or settable values from the monitoring, which lie within the aforementioned value ranges. A third waiting time for the advance of the bonding wave and up to the initiation of the next process step results therefrom.

An example of a process sequence of the first embodiment is reproduced below:

Loading of the Substrates

Bringing of the pin into contact with the wafer (force on the wafer 100 mN), without starting the bond Relative approach of the two wafers towards one another (spacing 40-200 m)

Application of force on the wafer in order to initiate a fusion bond between the two substrates (force 1500-2800 mN)

Deactivation of Heating

Waiting until the bonding wave has propagated sufficiently far (typically 1-5 s)—waiting time 1

Switching-off (exhaust) of the top wafer holding vacuum (in particular both zones simultaneously)

Waiting until the bonding wave has propagated further (in particular 2-15 s)—waiting time 3

Withdrawal of the Pin

Waiting until the bonding wave has propagated completely (in particular 5-90 s)—waiting time 4

The individual process steps can be generalized by the general technical teaching described above.

The process according to the second embodiment corresponds to the first embodiment from the first up to and including the seventh process step.

In an eighth process step, a reduction of the holding force or switching-off of the fixing means of the lower, second sample holder takes place. It would also be conceivable for the lower, second substrate to be released by a targeted removal of the fixing. Especially in the case of vacuum fixing means, which comprises a plurality of individually controllable vacuum tracks, the targeted removal of the fixing takes place preferably by means of a continuous removal of the vacuum, in particular from the centre to the edge. The eighth process step according to the invention is an important procedure for reducing the "run-out" error. By means of the reduction of the holding force or switching-off of the fixing means of the lower, second sample holder, the lower/second substrate is able, according to the invention, to adapt to the upper first substrate. The removal of the fixing results as it were in a removal of an additional (mathematical-mechanical) boundary condition which would restrict the process of bonding.

More generally, or to put it another way, holding force $F_{H2}$ is reduced during the bonding at a point in time $t_2$, in particular to an extent such that the second substrate is able to be deformed on the second sample holder.

A ninth process step corresponds to the eighth process step of the first embodiment.

In a tenth process step according to the invention, the second, in particular already partially bonded, substrate is fixed again on the lower, second sample holder. The tenth process step according to the invention is also an important procedure for reducing the "run-out" error. By means of a renewed fixing, in particular a renewed switching-on of the holding vacuum, the progress of the bonding is again restricted by the (mathematical-mechanical) boundary condition.

More generally, or to put it another way, holding force $F_{H2}$ is increased at a point in time $t_4$, in particular after the bonding.

An eleventh corresponds to the ninth and a twelfth corresponds to the tenth process step according to the first embodiment.

In a very special embodiment according to the invention, the switching-off of the fixing means according to process step 8 and the renewed switching-on of the fixing means according to process step 10 can be repeated several times before the completion of the bonding process. In particular, it is even possible to carry out the switching-off and renewed fixing in a location-resolved manner. This functions according to the invention primarily with the individually controllable vacuum tracks or vacuum segments already mentioned in the disclosure. In the most ideal case, therefore, a location-resolved and/or time-resolved removal or fixing of the lower/second substrate is carried out.

An example of the process sequence of the second embodiment is reproduced below:

Loading of the Substrates

Bringing of the pin (deformation means) into contact with the wafer (in particular force on the wafer of 100 mN), without starting the bond—pin force 1

Relative approach of the two wafers towards one another (in particular, spacing 40-200 m)—spacing 1

Pressing on the wafer in order to initiate a fusion bond between the two substrates (in particular force 1500-2800 mN)—pin force 2

Deactivation of Heating

Waiting until the bonding wave has propagated sufficiently far (in particular 1-5 s)—waiting time 1

Switching-off (exhaust) of the holding vacuum for the upper wafer (in particular both zones simultaneously)

Switching-off (exhaust) of the holding vacuum for the lower wafer

Waiting until the bonding wave has propagated further (in particular 2-15 s)—waiting time 3

Switching-on of the holding vacuum for the lower wafer—vacuum 1

Withdrawal of the Pin

Waiting until the bonding wave has propagated completely (in particular 5-90 s)—waiting time 4

The individual process steps can be generalized by the general technical teaching described above.

The process according to the third embodiment corresponds to the second embodiment from the first up to and including the ninth process step. In the ninth process step, the parameters are preferably set 10 to 40% lower than in the second embodiment. The waiting time until the tenth process step is thus reduced, wherein an additional waiting time is introduced, or the second waiting time is split up, in the third embodiment.

In a tenth process step according to the invention, ventilation of the space between the lower, second sample holder and the lower/second substrate lying thereon virtually unfixed takes place at a defined pressure. Pressure is understood here to mean the absolute pressure. An absolute pressure of 1 bar corresponds to atmospheric pressure. In order to carry out the process according to the invention, therefore, the chamber must be previously evacuated and then opened to the atmosphere, i.e. ventilated. The free mobility of the substrate is thus promoted, so that distortions with respect to the first substrate are further minimized. The pressure amounts in particular to between 1 mbar and 1000 mbar, preferably between 2.5 mbar and 800 mbar, still more preferably between 5 mbar and 600 mbar, most preferably between 7.5 mbar and 400 mbar, most preferably of all between 10 mbar and 200 mbar. In a further embodiment according to the invention, it is conceivable that the embodiment according to the invention takes place under atmospheric pressure up to the mentioned tenth process step and thereafter an over-pressure is generated in the chamber by means of a compressor. The pressure in this case lies in particular between 1 bar and 3 bar, preferably between 1 bar and 2.5 bar, still more preferably between 1 bar and 2 bar, most preferably between 1 bar and 1.5 bar, most preferably of all between 1 bar and 1.2 bar.

In an eighth process step, renewed or ongoing monitoring of the propagation of the advancing bonding wave in particular takes place by the measuring means. The monitoring tracks the advance of the bonding wave and therefore the progress of the bonding process over a period of more than 1 s, preferably more than 2 s, still more preferably more than 5 s, most preferably more than 10 s, most preferably of all more than 15 s. Instead of tracking the bonding process over a time interval, the tracking of the bonding wave can also be indicated via the, in particular radial, position of the bonding wave. The tracking of the bonding process takes place until the bonding wave is at a radial position which is at least 0.3 times, preferably at least 0.4 times, more preferably at least 0.5 times, most preferably 0.6 times, most preferably of all 0.7 times the diameter of the substrate. If tracking of the bonding progress is to be measurable by means of conductivity measurements over the surface, the bonding progress can also take place via the percentage proportion of the bonded or non-bonded surface. The monitoring of the bonding progress according to the invention takes place until more than 9%, preferably more than 16%, still more preferably more than 25%, most preferably more than 36%, most preferably of all more than 49% of the area has been bonded. Alternatively, the monitoring takes place continuously.

A control of the process sequence preferably takes place on the basis of defined/set or settable values from the monitoring, which lie within the aforementioned value ranges. A first waiting time for the advance of the bonding wave and up to the initiation of the next process step results therefrom.

In a twelfth process step according to the invention, the second, in particular already partially bonded, substrate is again fixed on the lower, second sample holder.

More generally, or to put it another way, holding force $F_{H2}$ is increased at a point in time $t_4$, in particular to after the bonding.

A thirteenth corresponds to the ninth and a fourteenth corresponds to the tenth process step of the first embodiment.

An example of a process sequence of the third embodiment is reproduced below:

Loading of the Substrates

Bringing of the pin into contact with the wafer (in particular, force on the wafer 100 mN), without starting the bond—pin force 1

Relative approach of the two wafers towards one another (in particular, spacing 40-200 m)—spacing 1

Pressing on the wafer in order to initiate a fusion bond between the two substrates (in particular force 1500-2800 mN)—pin force 2

Deactivation of Heating

Waiting until the bonding wave has propagated sufficiently far (in particular 1-5 s)—waiting time 1

Switching-off (exhaust) of the holding vacuum for the upper wafer (in particular both zones simultaneously)

Switching-off (exhaust) of the holding vacuum for the lower wafer

Waiting until the bonding wave has propagated further (in particular 1-10 s)—waiting time 2

Ventilation of the volume between the lower wafer and the chuck (lower sample holder) for a defined period at a defined pressure (in particular 10-200 mbar)—pressure 1

Waiting until the bonding wave has propagated further (in particular 2-15 s)—waiting time 3

Switching-on of the holding vacuum for the lower wafer—vacuum 1

Withdrawal of the Pin

Waiting until the bonding wave has propagated completely (in particular 5-90 s)—waiting time 4.

The individual process steps can be generalized by the general technical teaching described above.

The described processes can be continued, in particular in further process modules.

In a first, conceivable continuation, the produced substrate stack can be investigated, in particular in a metrology module. The investigation chiefly comprises measurements of the bond interface for the determination of:

alignment errors, in particular
overall alignment errors and/or
run-out errors and/or
defects, in particular
voids and/or
bubbles and/or
cracks If the inspection of the substrate stack reveals non-tolerable errors, the substrate stack is preferably separated again. The separation preferably takes place using processes and equipment which have been disclosed in publications EP 2697823B1 and WO2013/091714A1. Reference is made thereto in this regard. The investigation of the bond interface takes place in particular before a further heat treatment.

In a second, conceivable continuation, the produced substrate stack is heat-treated. The heat treatment leads in particular to a strengthening of the produced bond between the substrates of the substrate stack. The heat treatment takes place in particular at a temperature higher than 25° C., preferably higher than 100° C., more preferably higher than 250° C., most preferably higher than 500° C., most preferably of all higher than 750° C. The temperature essentially corresponds to heating temperature $T_H$. The produced bond strength is in particular greater than 1.0 J/m², preferably greater than 1.5 J/m², more preferably greater than 2.0 J/m², and most preferably of all greater than 2.5 J/m². The heat treatment preferably takes place under vacuum. The vacuum pressure is in particular less than 1 bar, preferably less than 800 mbar, still more preferably less than $10^{-3}$ mbar, most preferably less than $10^{-5}$ mbar, most preferably of all less than $10^{-8}$ mbar.

It is also conceivable, however, that the heat treatment is carried out in a protective gas atmosphere. This is particularly advantageous when the protective gases used facilitate the heat transfer. The thermal conductivity of the protective gases is in particular greater 0 W/(m*K), preferably greater than 0.01 W/(m*K), more preferably greater than 0.1 W/(m*K), most preferably greater than 1 W/(m*K). The thermal conductivity of helium lies for example between approx. 0.15 W/(m*K) and 0.16 W/(m*K). The protective gases are in particular:

noble gases, in particular helium, neon, argon, krypton and/or xenon molecular gases, in particular carbon dioxide and/or nitrogen any combinations of the aforementioned gases The substrates preferably have approximately identical diameters D1, D2, which diverge from one another in particular by less than 5 mm, preferably less than 3 mm, still more preferably less than 1 mm.

According to a further, in particular independent, aspect of the invention, the deformation takes place by mechanical actuating means and/or by temperature control of the first and/or second holding devices.

The deformation according to the invention can be implemented more easily by the fact that the first substrate and/or the second substrate is/are fixed exclusively in the region of the side walls at the first and/or second holding faces.

The results of the processes according to the invention are dependent on a multiplicity of physical parameters which can be directly attributed to the substrates or the surroundings. In the following text of the disclosure, the most important parameters and their influence on the "run-out" error are described. The parameters are roughly split up into single parameters and pair-parameters. A single parameter cannot be assigned to a symmetric side, in particular not to a substrate. A pair-parameter can have, on one symmetric side, in particular on a first substrate, a different value from on the respective opposite symmetric side, in particular on a second substrate. There is a first, upper symmetric side and a second, lower symmetric side. An example of a single parameter is bonding wave speed v or gas (mixture) pressure p. An example of a pair-parameter is substrate thicknesses d1 and d2.

When the influence of a pair-parameter on the bonding result is described in the following text, it is assumed, unless stated otherwise, that all the other values of each pair-parameter are preferably identical. The following example is mentioned by way of example. When the influence of two different substrate thicknesses d1 and d2 on the bonding result is described, it is assumed that both moduli of elasticity E1 and E2 of the two substrates are identical.

The aim is to minimize or completely eliminate the "run-out" error by an optimum, calculated and/or empirically determined, in particular time-dependent, bending line. A bending line is understood to mean the symmetry-reduced representation of a one-dimensional function, which maps the surface positions of a substrate, the substrate surface, as a function of the location coordinate, in particular of a radial coordinate. Symmetry-reduced means that, on account of the radially symmetrical symmetry of the two substrates, the calculation of the one-dimensional bending line is sufficient to allow conclusions to be drawn regarding the two-dimensional contacting of the substrates with one another that produces the mentioned minimal or completely eliminated "run-out" error. In simple terms, the bending line of a substrate can be described as the substrate surface in particular facing the bond interface. The description of the bending line for the first substrate preferably applies similarly to the second substrate.

The bending lines, i.e. the substrate surfaces, are decisively influenced according to the invention especially by one or more of the following parameters.

Substrate thicknesses d1, d2 are associated by volumes V1 and V2 and densities p1, p2 with masses m1, m2 and therefore gravitational forces G1, G2 of the two substrates. Gravitational force G1 of the first substrate has a direct influence on the acceleration behavior of the first, upper substrate in the direction of the second, lower substrate. When the lower fixing means is switched off, gravitational force G2 is a measure of the inertial force of the second, lower substrate and therefore a measure of the effort of the second, lower substrate to move along the bonding wave towards the first, upper substrate or to hold thereto or to remain lying thereon.

Moduli of elasticity E1, E2 are a measure of the stiffness of the substrates. They contribute decisively to the bending line and therefore also define the function with the aid of which the way in which the substrates move towards one another can be described.

Forces $F_1$ and $F_2$ have an influence on the area with which the two substrates are bonded together, in particular concentrically. Since there is a punctiform contacting only in the ideal case, it always has to be assumed that the contacting of the two substrates takes place at an area in the centre. The size of the area is determined decisively by forces $F_1$ and $F_2$. The size of the contact area is decisive for the boundary condition.

The overall thermal expansion state of the substrates can be influenced by temperatures T1, T2 of the two substrates. According to the invention, it is thus possible to ascertain the extent to which the substrates are deformed by thermal expansion relative to a reference temperature. The correct temperature regulation of the upper and/or lower substrate is therefore an essential aspect for a "run-out" compensation that is as correct and complete as possible. The temperatures of the two substrates can preferably be set differently. The temperatures are set in particular in such a way that the substrates are in a state of expansion in which the structures to be bonded together are congruent with one another, i.e. the "run-out" error disappears (on the assumption that an additional "run-out" error does not arise during bonding due to the parameters already mentioned above). The temperatures required for this can be determined by measuring means and/or empirically.

Gas (mixture) pressure p influences the resistance that is presented by the atmosphere against the substrates moving towards one another. A direct influence on bonding wave speed v can be exerted by the gas (mixture) pressure. Reference is made in this regard to publication WO2014191033 A1.

Holding forces $F_{H1}$, $F_{H2}$ serve primarily for the fixing of the substrates before the actual bonding process. Holding force $F_{H1}$ is a boundary condition for process steps 1 to 6 inclusive, but loses the influence of a boundary condition determining the bending line when the fixing means is switched off. Likewise, holding force $F_{H2}$ is used as a boundary condition only for the point in time of an active, lower fixing. Thus, new conditions must accordingly be formulated at the latest from process step 7 for elasticity-theoretical calculations.

Initial curvature radii $r_{10}$, $r_{20}$ are the initial radii of the substrates before the process according to the invention. They are functions of the location, but in particular are constant relative to the location. In a particular first embodiment according to the invention, initial curvature radius $r_{10}$ of the second, lower substrate is infinitely large, since the second lower substrate lies flat at the start of the process according to the invention. In a further particular second embodiment according to the invention, initial curvature radius $r_{10}$ of the second, lower substrate is a finite, positive or negative constant, corresponding to a constant convex or concave curvature. In this case, the second lower substrate is present in a shape curved convex or concave at the start of the process according to the invention. One such sample holder is described in publication WO2014191033A1, to which reference is made in this regard. In particular, at least initial curvature radius $r_{10}$ of the second, lower substrate corresponds to a sample holder curvature radius of the surface of the second, lower sample holder on which the second substrate lies.

Substrate curvature radii $r_1$, $r_2$ of the two substrates along the bonding wave are a result of the solution of the elasticity-theoretical equations taking account of the stated parameters. They are in particular functions of location and time.

The bonding wave speed is a result of the aforementioned parameters.

Further advantages, features and details of the invention emerge from the following description of preferred examples of embodiment and with the aid of the drawings.

BRIEF DESCRIPTION OF THE DRAWINGS

FIG. 1a shows a diagrammatic cross-sectional representation (not true to scale) of a first process step of a first embodiment of a method according to the invention, FIG. 1b shows a diagrammatic cross-sectional representation (not true to scale) of a second process step, FIG. 1c shows a diagrammatic cross-sectional representation (not true to scale) of a third process step, FIG. 1d shows a diagrammatic cross-sectional representation (not true to scale) of a fourth process step, FIG. 1e shows a diagrammatic cross-sectional representation (not true to scale) of a fifth process step, FIG. 1f shows a diagrammatic cross-sectional representation (not true to scale) of a sixth process step, FIG. 4 shows a diagrammatic cross-sectional representation (not true to scale) of two substrates.

DETAILED DESCRIPTION OF THE INVENTION

Figure 1G:
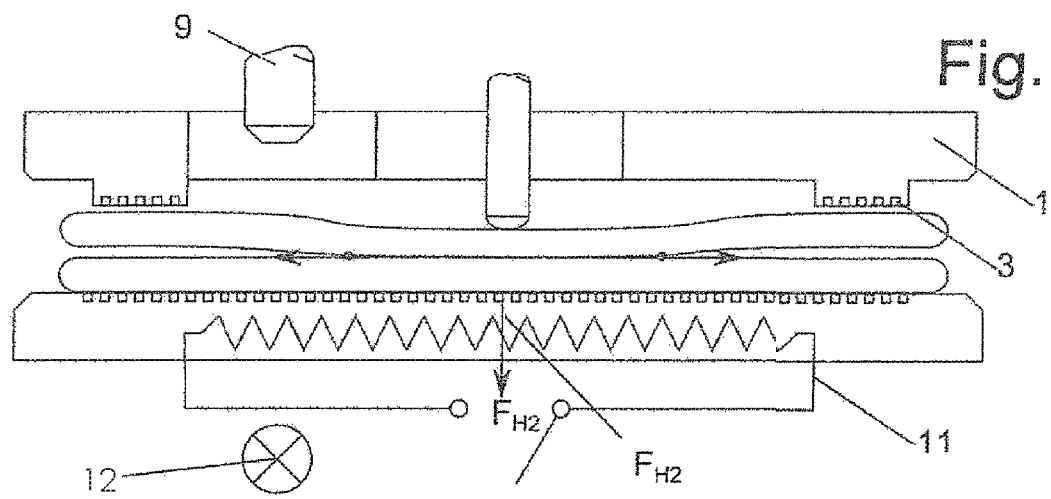
FIG. 1g shows a diagrammatic cross-sectional representation (not true to scale) of a seventh process step.

Identical components and components with the same function are denoted by the same reference numbers in the figures.

FIG. 1a shows a first process step, wherein a first, in particular upper, substrate 2 has been fixed to a sample holder surface 1o of a first, in particular upper, sample holder 1. The fixing takes place by means of fixing means 3 with a holding force $F_{H1}$.

First sample holder 1 has an, in particular central, through-opening, in particular bore 4. The through-opening is used to pass through a deformation means 4 for deforming first substrate 2.

In an advantageous embodiment shown here, first sample holder 1 comprises holes 5, through which an observation of the bonding progress can take place by measuring means. Hole 5 is preferably an elongated milled-out portion.

A second substrate 2' is loaded and fixed on a second, in particular lower sample holder 1'. The fixing takes place by means of fixing means 3' with a holding force $F_{H2}$.

Fixing means 3, 3' are preferably vacuum fixing means.

Sample holders 1, 1' in particular comprise heating 11 (heating means). For the sake of clearer illustration, heating 11 is represented diagrammatically only in second, lower sample holder 1' in the figures.

All the stated parameters or forces, which describe or influence the properties of substrates 2, 2', are generally functions of location and/or time.

Temperatures T1 and T2 of the two substrates 2, 2' are mentioned as an example of a parameter. Temperatures T1 and respectively T2 can generally be location-dependent, for which reason temperature gradients exist. In this case, it is expedient to indicate the temperatures as explicit functions of location and/or time.

The two gravitational forces G1 and G2 are mentioned as an example of a force. In the figures, they represent the total gravitational forces acting on substrates 2, 2'. It is however perfectly clear to the person skilled in the art that the two substrates 2, 2' can be split up into infinitesimal (dimensional) parts dm and that the influence of gravitation can be related to each of these dimensional parts dm. The gravitational force should therefore generally be indicated as a function of location and/or time.

Similar considerations apply to all the other parameters and/or forces.

FIG. 1b shows a second process step according to the invention, wherein deformation means 4, in particular a pin, exerts a pressure on a rear side 2i of first substrate 2 in order to bring about a deformation of first substrate 2. The deformation of first substrate 2 takes place with a first force $F_1$.

In a process step according to FIG. 1c, a relative approach of the two sample holders 1, 1' and therefore of the two substrates 2, 2' towards one another takes place up to a defined spacing. The approach can also take place during or before the second process step.

In a process step according to FIG. 1d, the initiation of the bond, in particular a pre-bond, takes place with a second force $F_2$. Second force $F_2$ provides for a further, in particular infinitesimally small deflection and a further approach of the two substrates 2, 2' and finally contacting at a contact point 7.

A bonding wave, more precisely a bonding wave front 8, starts to propagate in particular in a radially symmetrical manner, preferably concentrically, from contact point 7 at a bonding wave speed v. In the course of the further process steps, bonding wave speed v can change, so that bonding wave speed v can be defined as a function of location (or of time). Bonding wave speed v can be influenced by various measures.

In a further process step according to FIG. 1e, heating 11 of first and/or second sample holder 1, 1' is switched off and further heating of first and/or second substrate 2, 2' is thus interrupted. In a further process step according to FIG. 1f, monitoring of bonding wave front 8 takes place with the aid of measuring means 9, in particular at least one optical system, preferably an infrared optical system. Through the (at least one—the number preferably corresponds to the number of optical systems) hole 5, measuring means 9 can detect substrate rear side 2i of first substrate 2, more preferably the bond interface between the two substrates 2, 2', and thus bonding wave front 8. The detection of the bond interface takes place in particular at measuring means 9 which are sensitive to electromagnetic radiation, which can penetrate the two substrates 2, 2' without significant weakening. A light source 12 is preferably positioned above and/or below and/or inside sample holder 1', the electromagnetic radiation whereof illuminates and/or shines through sample holder 1' and/or substrates 2, 2' and can be detected by measuring means 9. The images thus taken are preferably black-and-white images. The brightness differences permit an unequivocal identification of the bonded regions from the non-bonded regions. The transition region between the two regions is the bonding wave. By means of such a measurement, it is possible in particular to determine the position of bonding wave front 8 and therefore, especially for a plurality of such positions, also bonding wave speed v.

FIG. 1g shows a further, seventh process step, wherein fixing means 3 of first sample holder 1 is released by the fact that holding force $F_{H1}$ is at least reduced. If fixing means 3 is a vacuum fixing means, more preferably a vacuum fixing means with a plurality of separately controllable vacuum segments (with a plurality of holding forces $F_{H1}$), the release takes place in particular from the inside outwards by means of a targeted switching-off of the vacuum segments (or reduction of holding force/holding forces $F_{H1}$) from the inside outwards.

Figure 1H:
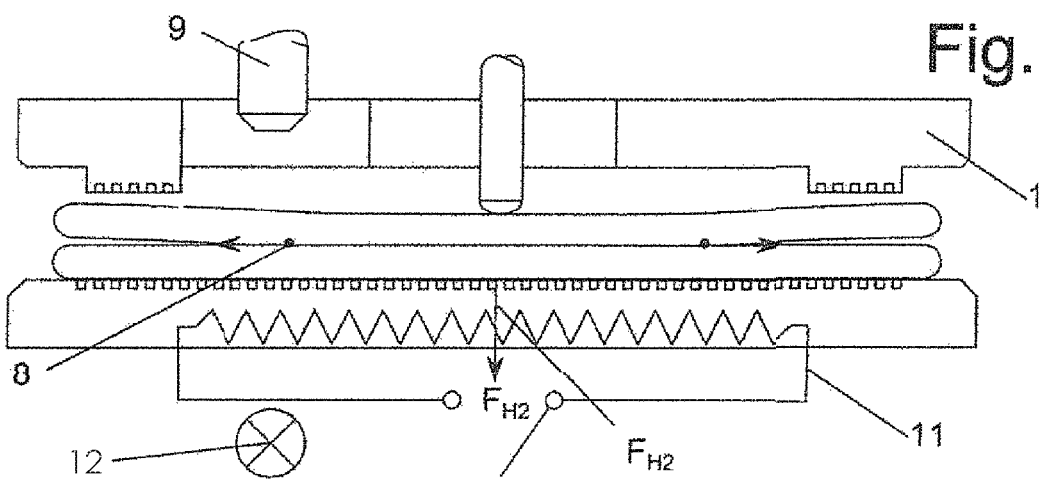
FIG. 1h shows a diagrammatic cross-sectional representation (not true to scale) of an eighth process step.

FIG. 1h shows a further process step, wherein bonding wave front 8 is monitored by measuring means 9 after the release from first substrate holder 1.

Figure 1I:
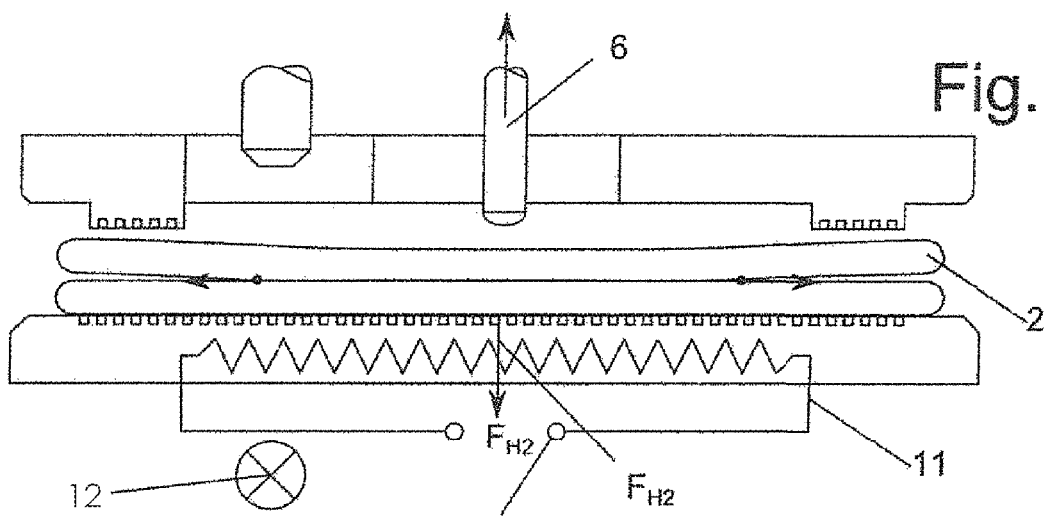
FIG. 1i shows a diagrammatic cross-sectional representation (not true to scale) of a ninth process step.

FIG. 1i shows a further process step, wherein the action of deformation means 6 on first substrate 2 is interrupted. If deformation means 6 is a mechanical deformation means, in particular a pin, the interruption takes place by a withdrawal. When nozzles are used, the interruption takes place by switching off the fluid flow. In the case of electrical and/or magnetic fields, the interruption takes place by switching off the fields.

Figure 1J:
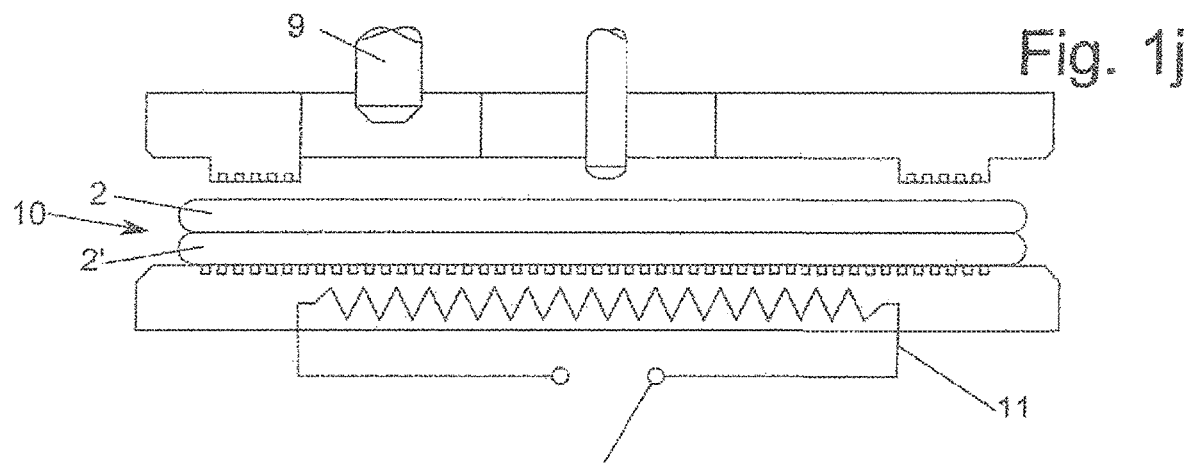
FIG. 1j shows a diagrammatic cross-sectional representation (not true to scale) of a tenth process step.

FIG. 1j shows a further process step, after which the two substrates 2, 2' are completely bonded together. In particular, further monitoring of bonding wave front 8 (no longer depicted, since the bond has already been completed in this process state) takes place in this process step with the aid of measuring means 9 up to the end of the bond, at which a substrate stack 10 formed from first and second substrates 2, 2' is completed.

Figure 2:
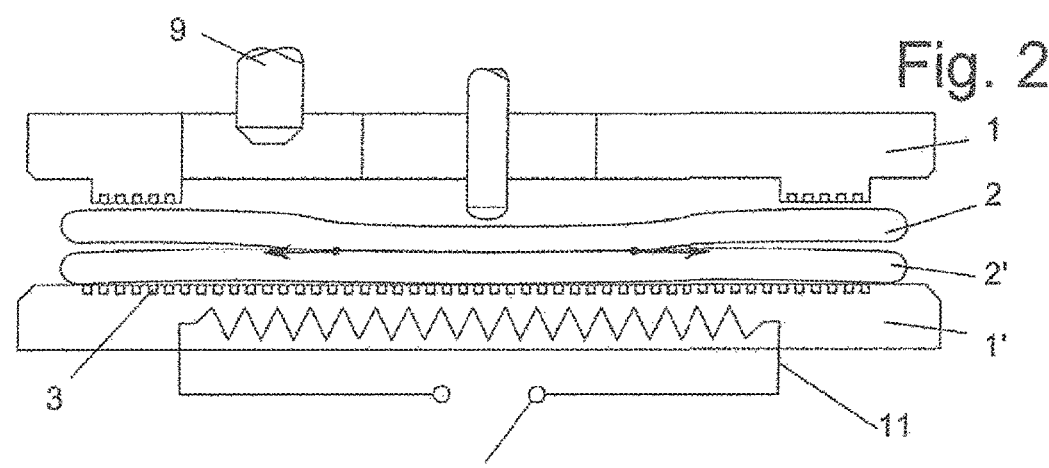
FIG. 2 shows a diagrammatic cross-sectional representation (not true to scale) of an additional process step of a third embodiment of a method according to the invention.

FIG. 2 shows an optional process step, wherein, in particular after the process step according to FIG. 1g, a reduction of holding force $F_{H2}$ of second, lower fixing means 3' of second, lower sample holder 1' takes place. In particular, holding force $F_{H2}$ is reduced to 0, i.e. the fixing is deactivated. The effect of this, in particular, is that second substrate 2' can move unhindered, in particular in the lateral direction along lower sample holder surface 1o'.

In a further, advantageous embodiment, second substrate 2' is raised along bonding wave front 8 to an extent such that it is raised, in particular locally, from second, lower sample holder 2'. This is brought about, in particular, by applying pressure to second substrate 2' from second sample holder 1'.

Gravitational force G2 counteracts the lifting of second substrate 2' throughout the bonding process and thus also influences the contacting of the two substrates 2, 2' and therefore the "run-out".

Figure 3:
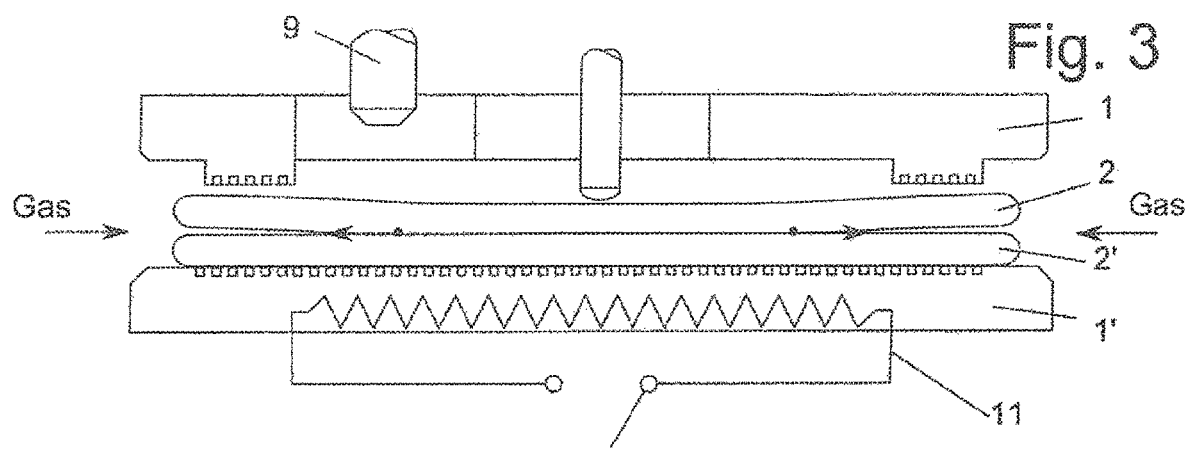
FIG. 3 shows a diagrammatic cross-sectional representation (not true to scale) of an optional additional process step.

FIG. 3 shows an optional process step according to the invention, wherein the chamber in which the process according to the invention proceeds is ventilated before the production of the completely bonded substrate stack 10. The ventilation serves in particular to control advancing bonding wave front 8. A precise description of the possible ways of exerting an influence is disclosed in publication WO2014/191033A1, to which reference is made in this regard. The ventilation takes place with a gas or gas mixture. In particular, the ventilation takes place by opening a valve to the surrounding atmosphere, so that the chamber is ventilated with the surrounding gas (mixture). Subjecting the chamber to an over-pressure with a gas or gas mixture is also conceivable, instead of ventilation to the surrounding atmosphere.

FIG. 4 shows a diagrammatic representation (not to scale) of two substrates 2, 2', which are defined by a plurality of parameters. Substrate surfaces 2o, 2o' correspond to the bending lines of first upper substrate 2 and respectively second, lower substrate 2' at a defined point in time. They are defined decisively by the aforementioned parameters. Their shape changes as a function of time during the bonding process according to the invention.

LIST OF REFERENCE NUMBERS

1o, 1o' sample holder surfaces
2, 2' substrates
2o, 2o' substrate surfaces
2i substrate rear side
3, 3' fixing means
4 bore
5 holes
6 deformation means
7 contact point
8 bonding wave front
9 measuring means
10 substrate stack
11 heating
12 light source
$F_1, F_2$ force
$F_{H1}, F_{H2}$ holding force
v bonding wave speed
Tx heating temperature
T1, T2 substrate temperatures
E1, E2 substrate moduli of elasticity
d1, d2 substrate thicknesses
V1, V2 substrate volumes
m1, m2 substrate masses
p1, p2 substrate densities
G1, G2 substrate gravitational forces
r1, r2 substrate curvature radii
r10, r20 initial substrate curvature radii
D substrate edge spacing Having described the invention, the following is claimed:

1. A device for bonding a first substrate with a second substrate, comprising:
   an infrared camera configured to digitalize data related to a bonding wave occurring during contact between the first substrate and the second substrate; and
   a computer to which the digitalized data is relayed, the computer being configured to detect a position of the bonding wave from the digitalized data and control the bonding wave based on the detected position of the bonding wave.

2. The device according to claim 1, wherein the computer is further configured to detect a bond interface between the first substrate and the second substrate from the digitalized data.

3. The device according to claim 1, wherein the computer is further configured to detect a rear side of the first substrate from the digitalized data.

4. The device according to claim 1, wherein the computer is further configured to detect a speed of the bonding wave from the digitalized data.

5. The device according to claim 1, wherein the computer is further configured to measure the bonding wave from the digitalized data.

6. The device according to claim 1, further comprising:
a first substrate holder configured to hold the first substrate with a first holding force $F_{H1}$; and
a second substrate holder configured to hold the second substrate with a second holding force $F_{H2}$, and
wherein at least one of the first and second holding forces $F_{H1}$ and $F_{H2}$ is reduced to 0 by the computer to control the bonding wave.

7. The device according to claim 1, wherein the computer is further configured to detect a state of the bonding wave and an advance of the bonding wave from the digitalized data.

8. The device according to claim 1, wherein the computer is further configured to detect a size of a bonded area from the digitalized data.

9. The device according to claim 6, wherein the first and second substrate holders respectively fix the first and second substrates thereto by vacuums respectively applied from the first and second substrate holders,
wherein the vacuums respectively applied from the first and second substrate holders impose first and second holding forces $F_{H1}$ and $F_{H2}$ to respectively fix the first and second substrates to the first and second substrate holders, and
wherein the computer is further configured to control reducing of the vacuums to reduce the first and second holding forces $F_{H1}$ and $F_{H2}$ and respective releasing of the first and second substrates from the first and second substrate holders.

10. The device according to claim 1, wherein the detected position of the bonding wave is a radial position of the bonding wave corresponding to at least 0.1 times respective diameters of the first and second substrates.

11. The device according to claim 1, wherein the computer is further configured to detect from the digitalized data a percentage amount of a bonded surface of the first and second substrates with respect to a non-bonded surface of the first and second substrates.

12. A method for bonding a first substrate with a second substrate, comprising:

digitalizing data related to a bonding wave occurring during contact between the first substrate and the second substrate;
detecting, via a computer, a position of the bonding wave from the digitalized data; and
controlling, via the computer, the bonding wave based on the detected position on the bonding wave.

13. The method according to claim 12, wherein the data is digitalized by an infrared camera.

14. The method according to claim 12, further comprising:
detecting, via the computer, a size of the bonded area from the digitalized data.

15. The method according to claim 12, further comprising:
detecting, via the computer, a rear side of the first substrate from the digitalized data.

16. The method according to claim 12, further comprising:
detecting, via the computer, a bond interface between the first substrate and the second substrate from the digitalized data.

17. The method according to claim 12, further comprising:
detecting, via the computer, a state of the bonding wave and an advance of the bonding wave from the digitalized data.

18. The method according to claim 12, further comprising:
detecting, via the computer, a speed of the bonding wave from the digitalized data.

19. The method according to claim 12, further comprising:
measuring, via the computer, the bonding wave from the digitalized data.

20. The method according to claim 12, further comprising:
detecting, via the computer, a percentage amount of a bonded surface of the first and second substrates with respect to a non-bonded surface of the first and second substrates from the digitalized data.

* * * * *